(12) United States Patent
Filosa et al.

(10) Patent No.: US 9,164,154 B2
(45) Date of Patent: Oct. 20, 2015

(54) ELECTRO PERMANENT MAGNETIC SYSTEM WITH MAGNETIC STATE INDICATOR

(75) Inventors: Giuseppe Filosa, Caravaggio (IT); Daniele Obori, Mozzo (IT); Matteo Cipolla, Cassina de' Pecchi (IT); Daniele Messinella, Caravaggio (IT); Andrea Parolari, Caravaggio (IT); Albino Premoli, Gallignano di Soncino (IT)

(73) Assignees: S.P.D. S.P.A., Caravaggio (IT); SCHUNK GMBH & CO. KG SPANN-UND GREIFTECHNIK, Lauffen/Neckar (DE)

( * ) Notice: Subject to any disclaimer, the term of this patent is extended or adjusted under 35 U.S.C. 154(b) by 0 days.

(21) Appl. No.: 14/237,069

(22) PCT Filed: Aug. 6, 2012

(86) PCT No.: PCT/IB2012/001502
§ 371 (c)(1),
(2), (4) Date: Feb. 4, 2014

(87) PCT Pub. No.: WO2013/021257
PCT Pub. Date: Feb. 14, 2013

(65) Prior Publication Data
US 2014/0202374 A1 Jul. 24, 2014

(30) Foreign Application Priority Data
Aug. 11, 2011 (IT) ............... BG2011A0036

(51) Int. Cl.
*G08B 21/00* (2006.01)
*G01R 33/028* (2006.01)
*G01R 33/00* (2006.01)
*H01F 13/00* (2006.01)

(52) U.S. Cl.
CPC .......... *G01R 33/028* (2013.01); *G01R 33/0058* (2013.01); *G01R 33/0088* (2013.01); *H01F 13/00* (2013.01)

(58) Field of Classification Search
CPC ............. G01R 33/028; G01R 33/0058; G01R 33/0088; H01F 13/00
USPC .......................................... 340/540
See application file for complete search history.

(56) References Cited

U.S. PATENT DOCUMENTS 4,429,553 A 2/1984 Frund et al.
2009/0256676 A1* 10/2009 Piccirillo et al. ............. 340/5.65
2010/0013583 A1 1/2010 Kimura

FOREIGN PATENT DOCUMENTS

| CN | 1543388 A | 11/2004 |
| CN | 101228002 A | 7/2008 |
| CN | 101610873 A | 12/2009 |
| DE | 102005035042 A1 | 2/2007 |
| GB | 2077776 A | 12/1981 |

OTHER PUBLICATIONS

Search Report Chinese Patent Application No. 201280039206.4 Mailed Jul. 14, 2015.

* cited by examiner

*Primary Examiner* — Kerri McNally
(74) *Attorney, Agent, or Firm* — King & Schickli, PLLC

(57) ABSTRACT

An electro permanent magnetic system (10) for anchoring ferromagnetic material, with magnetic state indicator (14), comprising: an electro permanent magnetic module (12), a control unit (11) for said electro permanent magnetic module (12), an electrical connection system (13) between said control unit (11) and said electro permanent magnetic module (12); a magnetization indicator (14) for said electro permanent magnetic module (12) associated with the electro permanent magnetic module (12); characterized in that said magnetization indicator (14) is a bistable indicator having two stable states; said magnetization indicator (14) not requiring electrical power to remain in one of said stable states; said magnetization indicator (14) being electrically fed only in association with the magnetization or demagnetization of said electro permanent magnetic module (12), to pass from one stable state to the other of said two stable states.

8 Claims, 3 Drawing Sheets

ELECTRO PERMANENT MAGNETIC SYSTEM WITH MAGNETIC STATE INDICATOR

The present invention relates to an electro permanent magnetic system with magnetic state indicator and to a method for implementing such a system.

Electro permanent magnetic clamping systems are appliances intended for anchoring ferromagnetic material to enable mechanical working by machine tools, or for use as gripping means in handling and/or lifting systems.

An electro permanent magnetic clamping system consists of a magnetic section (commonly known as an electro permanent magnetic module), and of the relative electronic activation/deactivation system (commonly known as the control unit).

The electro permanent magnetic module consists of a soft iron support structure arranged to contain all the internal components; one or more soft iron pole pieces, of shapes and characteristics which can vary to adapt to the various requirements; a variable number of permanent magnets variously constituted and disposed; and one or more solenoids required for module activation/deactivation. Typically, a control unit consists of a bidirectional controlled power rectifier which suitably powers the solenoids of the electro permanent magnetic module; one or more control panels to enable the operator to activate and deactivate the electro permanent magnetic module; and an electrical connection system, typically a cable to connect the control unit to the electro permanent magnetic module.

An electro permanent magnetic module is a magnetic system characterised by the following states.

Magnetized: stable state, does not require energy from the control unit and remains indefinitely in the same state. Unmagnetized: stable state, does not require energy from the control unit and remains indefinitely in the same state. Transition from unmagnetized to magnetized: limited duration state which enables the magnet to be activated; during this stage the control unit supplies energy to the magnetic module.

Transition from magnetized to unmagnetized: limited duration state which enables the magnet to be deactivated; during this stage the control unit supplies energy to the magnetic module.

From the aforesaid, a magnetic module of electro permanent type does not require any form of energy to perform its function, except for that provided during the activation/deactivation stage.

The task of the control unit is to activate/deactivate the electro permanent magnetic module by magnetization, demagnetization or polarity inversion operations on a part or all of the permanent magnets contained within the module.

Except for the time required to complete the two transition operations, the control unit can be electrically disconnected from the magnetic module.

Moreover, typically the activation/deactivation operations are of very short duration, just a few seconds at the most. As stated heretofore, the control unit and the magnetic module are physically separate subsystems connected together by electric cables; their interconnection varies on the basis of the type of product.

It may be fixed, in the sense that the connection cables do not present a connector enabling the magnetic module to be disconnected manually from the control unit.

It may also be removable, in the sense that the connection cables present one or more connectors enabling the magnetic module to be disconnected manually from the control unit.

In any event, the type of connection lies outside problems regarding the intrinsic system operation and is related only to installation requirements.

With regard to installation on machine tools such as millers, CNC machining centres and lathes, the magnetic module is typically provided with a connection of removable type (plug-socket connection) to ensure greater simplicity of installation and prevent the presence of electric cables on the machine table.

This solution is moreover obligatory in machines provided with automated pallet changeover systems.

Typically, the control units used for magnetizing/demagnetizing the magnetic modules are provided with a system for visually indicating the state of the magnetic module via lamps.

Knowledge of the magnetic state is of fundamental importance in ensuring operator safety, for example during the operations involved in positioning pieces on the magnetic module, in starting machining operations, etc. The salient characteristics of these visual display systems are the following.

Usually, they are not installed on the module itself. This does not facilitate easy legibility of the magnetic state during the positioning operations.

In the case of removable connection magnetic modules, as the information of the module magnetization state resides in the control unit, removing the connection does not ensure information consistency. In other words, disconnecting the control unit from the magnetic module makes it impossible to recognize the magnetic state of the module in environments in which more than one magnetic module and/or more than one control unit are present.

In the case of non-removable connection systems (for example lifters), indication of the magnetization is a function of the presence of electrical energy; lack of energy banally causes extinguishing of the indicator lamps.

An object of the present invention is to provide an electro permanent magnetic system with magnetic state indicator able to store the information relative to the magnetic state in the system itself.

Another object is to render the magnetic state information available to the user via a rapid consultation system.

A further object is to not require energy for indicating the magnetic state of the system.

These and other objects are attained according to the present invention by an electro permanent magnetic system intended for anchoring ferromagnetic material, with magnetic state indicator, and by the relative method for its implementation, in accordance with the accompanying claims.

Further characteristics of the invention are described in the dependent claims.

This solution has various advantages compared with solutions of the known art.

The proposed solution provides a bistable magnetization indicator of the electro permanent magnetic module, the task of which is to associate with each of the two available stable states the corresponding magnetized and demagnetized states of the magnetic module, without the need to maintain it electrically powered.

By virtue of the fact that it does not require electrical powering, it can be positioned rigid with the electro permanent magnetic module even in the case of removable interconnections.

Sensors are also present to ensure that the information shown by the indicator is true and correct. In this respect, if a malfunction occurs during the magnetization and demagnetization stages, the indicator does not change state.

The characteristics and advantages of the present invention will be apparent from the ensuing detailed description of one embodiment thereof, illustrated by way of non-limiting example in the accompanying drawings, in which.

Figure 1:
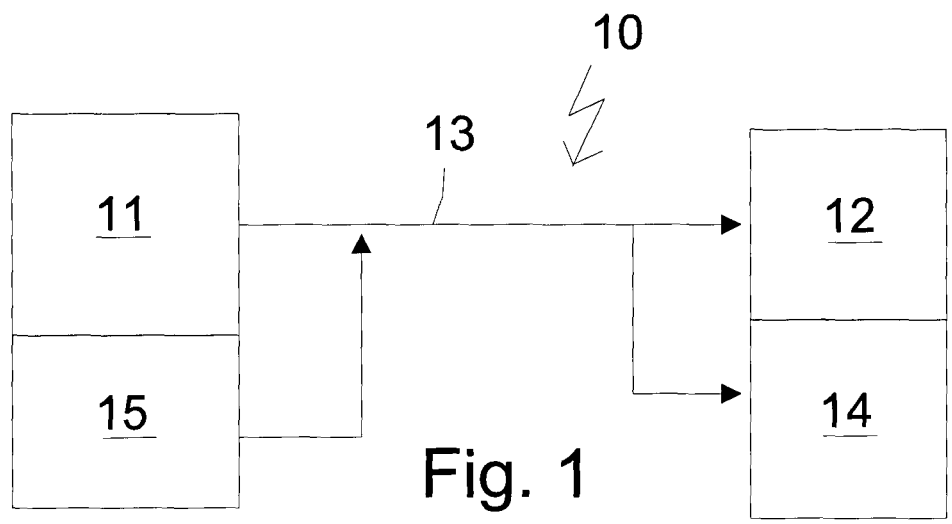
FIG. 1 shows schematically an electro permanent magnetic system with magnetic state indicator, in accordance with the present invention.
Figure 2:
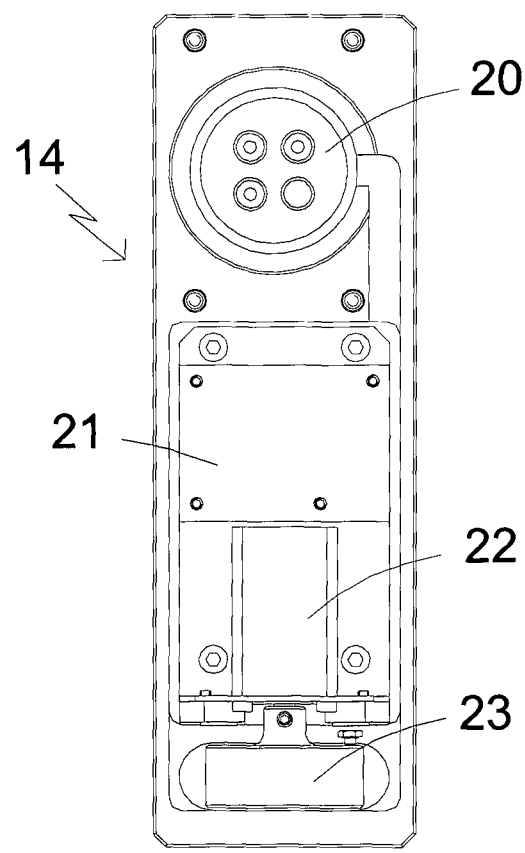
FIG. 2 shows schematically a magnetic state indicator, in accordance with the present invention.
Figure 3:
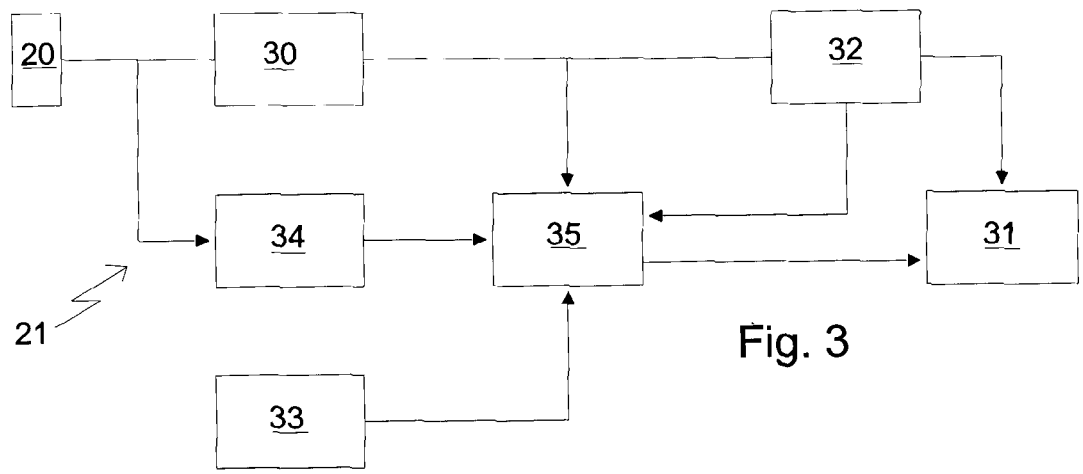
FIG. 3 shows schematically the electrical scheme of a magnetic state indicator, in accordance with the present invention.
Figure 4:
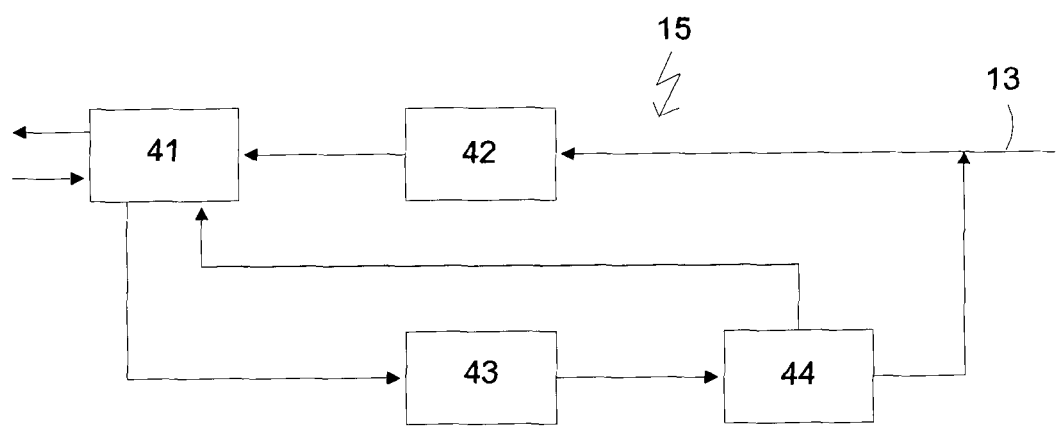
FIG. 4 shows schematically an interface between the control system of the electro permanent magnetic system and the electro permanent magnetic module containing the magnetic state indicator, in accordance with the present invention.

With reference to the accompanying figures, an electro permanent magnetic system 10 with magnetic state indicator, in accordance with the present invention, comprises an electronic control unit 11 for activating an electro permanent magnetic module 12, and an electrical connection system 13 between the control unit 11 and the electro permanent magnetic module 12. It also comprises a magnetization indicator 14 associated with the electro permanent magnetic module 12, and an interface 15 between the control unit 11 and the electro permanent magnetic module 12.

The electrical connection system 13 comprises both the electrical power cables of the electro permanent magnetic module 12, required for its magnetization and demagnetization, and the communication cables between the interface 15, the electro permanent magnetic module 12, and the magnetization indicator 14.

The operation of verifying the correct magnetization and/or demagnetization is usually carried out by the control unit 11, for example by analyzing in various ways the main characteristics of the current absorbed by the magnetic system during the transient magnetization and demagnetization stages. Analysis of the mean current, of the peak current, of the charge fed, are all known methods which enable the control unit 11 to correctly know the magnetization state.

The information relative to the state of the magnetic module 12, however obtained, is therefore present in the control unit 11.

According to the present invention, the control unit 11 transfers the information to the magnetization indicator 14 via the electrical connection system 13.

The magnetization indicator 14 comprises a connector 20 for the electrical connection system 13, an electronic control card 21, a stepping motor 22, and a rotatable two-colour cylindrical wheel 23 connected to the motor 22, one half of the wheel being of one colour and the other half of another colour.

The electronic control card 21 comprises an input connector 20 for the control signal originating from the electrical connection system 13; a diode bridge rectifier 30 connected directly to the connector 20; a command circuit 31 for the stepping motor 22, a measuring device 32 for the current absorbed by the stepping motor 22, connected in series between the rectifier 30 and the command circuit 31; a position sensor (or several sensors) 33 for the stepping motor 22; and a polarization sensor 34 for the control signal present at the terminals of the connector 20.

It also comprises, for the card 21, a control circuit 35 which communicates with all the elements of the electronic control card 21.

The interface 15 comprises a control circuit 41 for the interface 15 itself, communicating with the control unit 11; a plan presence verification circuit 42 (carry out in known manner); a control circuit 43 for the magnetization indicator 14; and a circuit 44 for verifying the current absorbed by the magnetization indicator 14.

Preferably, the magnetization indicator 14 is rigid with the magnetic module 12 by being fixed to it or positioned in its vicinity, such that the operator using the magnetic module 12 is conscious of the state of this latter.

Alternatively it can also be separated from the magnetic module 12 and have only an electrical connection with the interface 15.

An advantageous embodiment of the magnetization indicator 14 has been represented and described, however other embodiments are possible.

Figure 5:
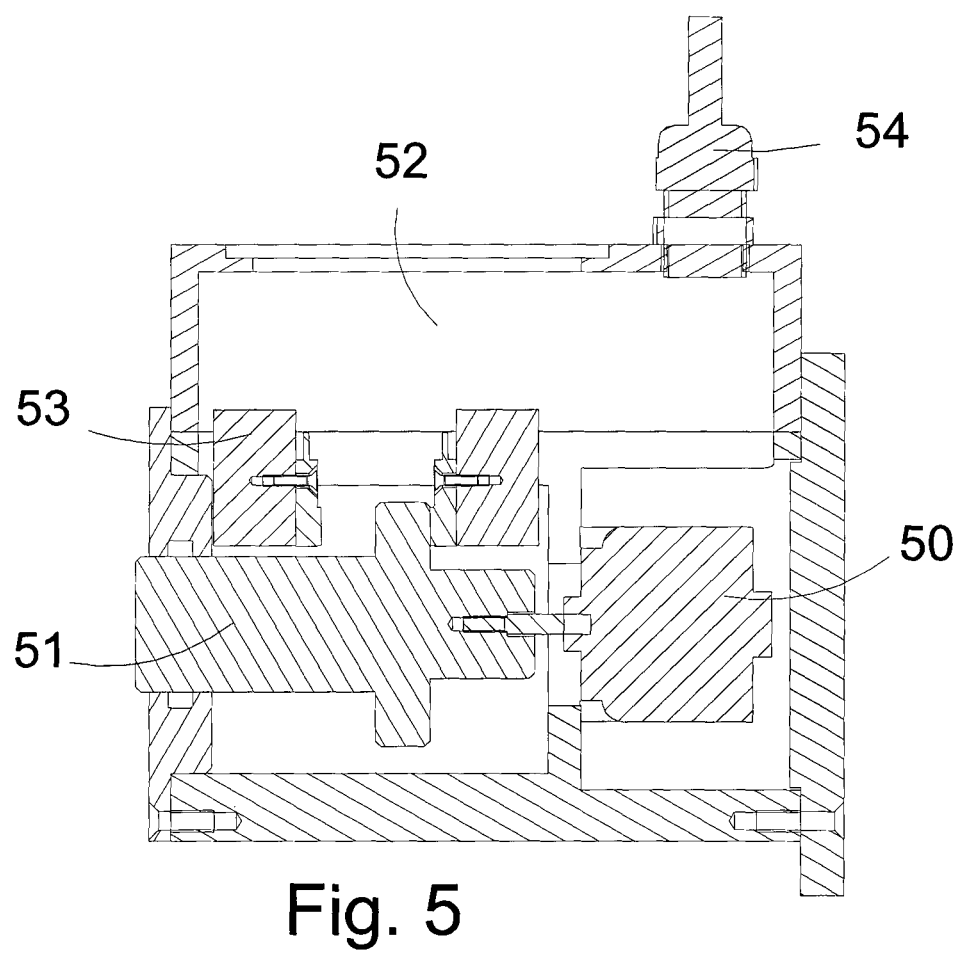
FIG. 5 shows schematically a magnetic state indicator, in accordance with a variant of the present invention.

For example, a magnetization indicator 14 can be formed as in FIG. 5 and comprises a linear stepping motor 50, an indication cylinder 51 connected to the motor 50, an electronic control circuit 52 for the indicator, a position sensors 53, and a connector 54 for connection to the interface 15.

The magnetization indicator 14 can also be formed in other ways, provided it is of bistable type, i.e. comprising two stable states, and does not require electrical power to remain in the stable states. The electrical power for the magnetization indicator 14, which is provided in association with the feed to the electro permanent magnet for changing its magnetization state (and is normally supplied after magnetization or demagnetization of the electro permanent magnet), serves only for passing from one state to the other. For example it can be in the form of a bistable relay.

The operation of the system according to the invention is evident from that described and illustrated, and in detail is substantially as follows.

On receiving a magnetization and/or demagnetization request, the control unit 11 initially verifies that the magnetic module 12 is connected to it by the electrical connection system 13.

This is done by the plan presence verification circuit 42, by interrogating the control circuit 41.

If the response is positive, the control unit 11 electrically powers the solenoids of the magnetic module 12.

As already stated, for example, from the analysis of the current absorbed by the magnetic module 12 during the transient stage, the control unit 11 is able to determine the correct magnetization or demagnetization state of the module 12.

Hence having determined the state of the magnetic module 12, the control unit 11 transmits the information to the indicator 14 via the interface 15.

Specifically, the control logic 41 activates the control circuit 43. The circuit 43, by way of the electrical connection system 13, provides a suitably polarized voltage to the indicator 14.

On analyzing the voltage received, the indicator 14 is able to recognize the direction of the voltage electrical polarization by virtue of the polarization sensor 34.

By using the information obtained from the sensor 34 and from the sensors 33, the management circuit 35 is able to determine a correct operating strategy for the stepping motor 22 by the command circuit 31 for the stepping motor 22.

According to the correct movement strategy, the motor 22 rotates through 180° to show the appropriate colour associated with the magnetic state, by means of the two-colour wheel 23 (red: unmagnetized, green: magnetized). The current measuring device 32 detects any problems arising during its movement and immediately interrupts it. During the movement stage, the magnetization indicator 14 absorbs a specific current which is measured by the circuit 44 verifying the current absorbed by the magnetization indicator 14.

This information enables the control circuit 41 to determine the indicator transition time and to prohibit operation of the control unit 11 until this transition has terminated.

After the appropriate movement of the two-colour wheel 23, the magnetization indicator 14 lies in the waiting state.

Removal of the connection 13 does not modify the positioning of the two-colour wheel 23 in any manner, hence the information associated with the state of the magnetic module 12 is available, unalterable, and does not require energy for its display.

Moreover, the information relative to the magnetic state of the module 12 is always unequivocally associated with it, a condition which is not necessarily true in the case in which the information relative to the state resides in the control unit 11 and the connection system 12 is disconnected from the magnetic module.

The constituent circuits of the electro permanent magnetic system with magnetic state indicator according to the present invention will not be further described in detail as an expert of the art is capable of implementing them from the teachings of the preceding description.

In practice, the materials used for the electro permanent magnetic system with magnetic state indicator, and the dimensions, can be chosen at will according to requirements and to the state of the art.

The invention claimed is:

1. An electro permanent magnetic system (10) for anchoring ferromagnetic material comprising: an electro permanent magnetic module (12), a control unit (11) for said electro permanent magnetic module (12), an electrical connection system (13) between said control unit (11) and said electro permanent magnetic module (12); a magnetization indicator (14) able (or storing and showing the information relative to the magnetic state of said electro permanent magnetic module (12); characterised in that said magnetization indicator (14) is a bistable indicator having two stable states; said magnetization indicator (14) not requiring electrical power to remain in one or in the other of said two stable states; said magnetization indicator (14) being electrically powered only in association with the magnetization or demagnetization of said electro permanent magnetic module (12), to pass from one stable state to the other of said two stable states, without requiring energy for its display.

2. A system as claimed in claim 1, characterised in that said magnetization indicator (14) is positioned rigid with said electro permanent magnetic module (12).

3. A system as claimed in claim 1, characterised in that said magnetization indicator (14) is of electromechanical type.

4. A system as claimed in claim 1, characterised in that said magnetization indicator (14) comprises an electric motor (22, 50) connected to a rotatable two-colour cylindrical wheel (23).

5. A system as claimed in claim 4, characterised by comprising a positioning sensor (53) for said electric motor (50).

6. A method for implementing an electro permanent magnetic system (10) for anchoring ferromagnetic material, with a magnetic state indicator (14) for an electro permanent magnetic module (12), characterised in that said magnetic state indicator (14) is bistable; and by comprising the stage of electrically powering said electro permanent magnetic module (12) to magnetize or demagnetize said electro permanent magnetic module (12); electrically powering said bistable magnetic state indicator (14) only in association with the stage of electrically powering said electro permanent magnetic module (12); said stage of electrically powering said bistable magnetic state indicator (14) comprising the stage of switching said bistable magnetic state indicator (14) from one stable state to the other stable state without requiring energy for its display; identifying one stable state from the other stable state of said bistable magnetic state indicator (14) by means of a two-colour element.

7. A method as claimed in claim 6, characterised by comprising the step of rigidly associating said magnetic state indicator (14) with said electro permanent magnetic module (12).

8. A method as claimed in claim 6, characterised by comprising the step of blocking the stage of electrically powering said bistable magnetic state indicator (14) if a malfunction occurs during the stage of electrically powering said electro permanent magnetic module (12).

\* \* \* \* \*